(12) United States Patent
Kao et al.

(10) Patent No.: US 10,971,589 B2
(45) Date of Patent: Apr. 6, 2021

(54) LOW-K FEATURE FORMATION PROCESSES AND STRUCTURES FORMED THEREBY

(71) Applicant: Taiwan Semiconductor Manufacturing Company, Ltd., Hsinchu (TW)

(72) Inventors: Wan-Yi Kao, Baoshan Township (TW); Chung-Chi Ko, Nantou (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/715,899

(22) Filed: Dec. 16, 2019

(65) Prior Publication Data

US 2020/0119151 A1 Apr. 16, 2020

Related U.S. Application Data

(63) Continuation of application No. 15/994,561, filed on May 31, 2018, now Pat. No. 10,510,852.

(60) Provisional application No. 62/591,316, filed on Nov. 28, 2017.

(51) Int. Cl.
| | |
|---|---|
| *H01L 29/417* | (2006.01) |
| *H01L 29/66* | (2006.01) |
| *H01L 21/8234* | (2006.01) |
| *H01L 21/28* | (2006.01) |
| *H01L 29/78* | (2006.01) |
| *H01L 27/088* | (2006.01) |

(52) U.S. Cl.
CPC .. *H01L 29/41791* (2013.01); *H01L 21/28194* (2013.01); *H01L 21/823431* (2013.01); *H01L 21/823468* (2013.01); *H01L 27/0886* (2013.01); *H01L 29/66795* (2013.01); *H01L 29/785* (2013.01); *H01L 21/823437* (2013.01); *H01L 2029/7858* (2013.01)

(58) Field of Classification Search
CPC ......... H01L 29/41791; H01L 21/28194; H01L 21/823468; H01L 29/785; H01L 29/7858
See application file for complete search history.

(56) References Cited

U.S. PATENT DOCUMENTS

| | | | |
|---|---|---|---|
| 9,472,628 B2 | 10/2016 | Cheng et al. | |
| 9,559,184 B2 | 1/2017 | Ching et al. | |
| 2017/0148797 A1 | 5/2017 | Kim et al. | |
| 2018/0202042 A1* | 7/2018 | Fafard | C23C 16/30 |
| 2018/0358436 A1 | 12/2018 | Jambunathan et al. | |

(Continued)

FOREIGN PATENT DOCUMENTS

| | | |
|---|---|---|
| CN | 103383918 A | 11/2013 |
| CN | 106252410 A | 12/2016 |

(Continued)

*Primary Examiner* — Zandra V Smith
*Assistant Examiner* — Andre C Stevenson
(74) *Attorney, Agent, or Firm* — Slater Matsil, LLP

(57) ABSTRACT

Embodiments of the present disclosure relate to a method of forming a low-k dielectric material, for example, a low-k gate spacer layer in a FinFET device. The low-k dielectric material may be formed using a precursor having a general chemical structure comprising at least one carbon atom bonded between two silicon atoms. A target k-value of the dielectric material may be achieved by controlling carbon concentration in the dielectric material.

20 Claims, 10 Drawing Sheets

(56) References Cited

U.S. PATENT DOCUMENTS

2019/0040279 A1\* 2/2019 Khandelwal .............. C07F 7/10
2019/0067445 A1\* 2/2019 Ching ................. H01L 29/7851

FOREIGN PATENT DOCUMENTS

WO  2017007986 A1  1/2017
WO  2017111850 A1  6/2017

\* cited by examiner

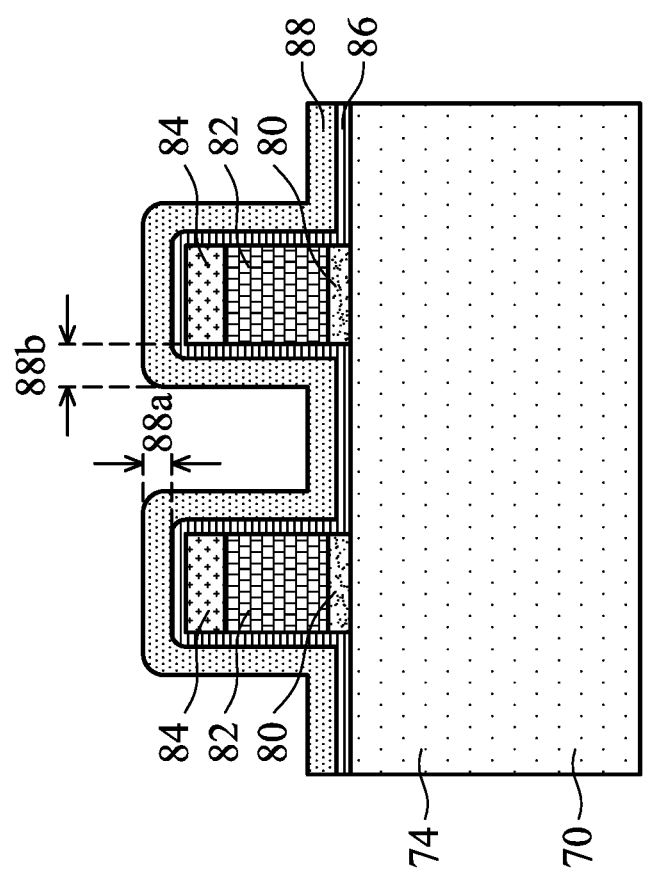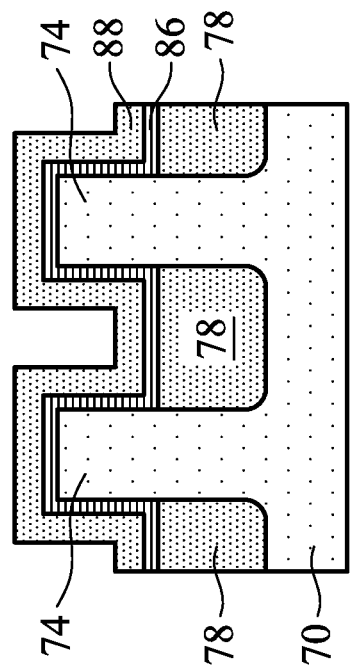
FIG. 2A
FIG. 2B

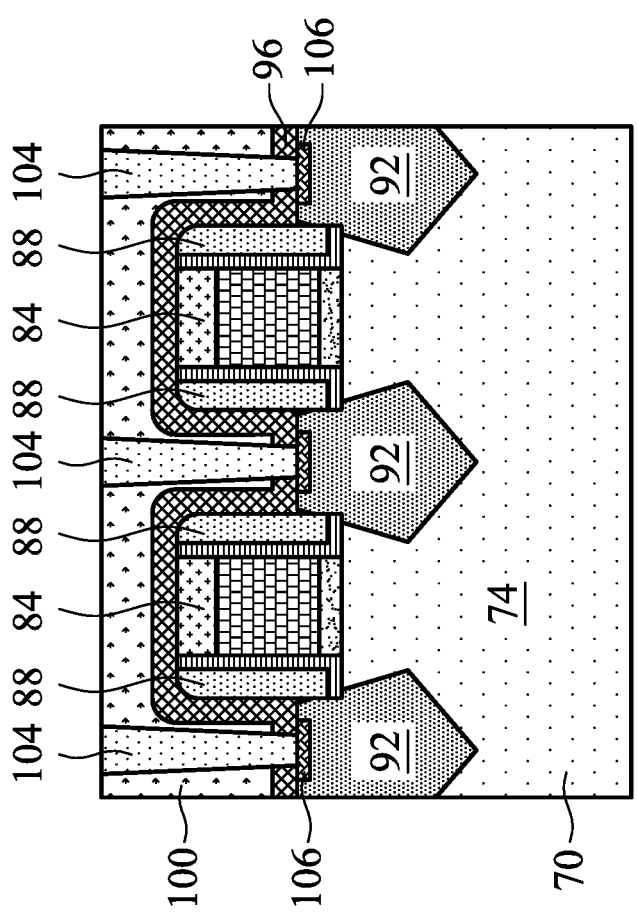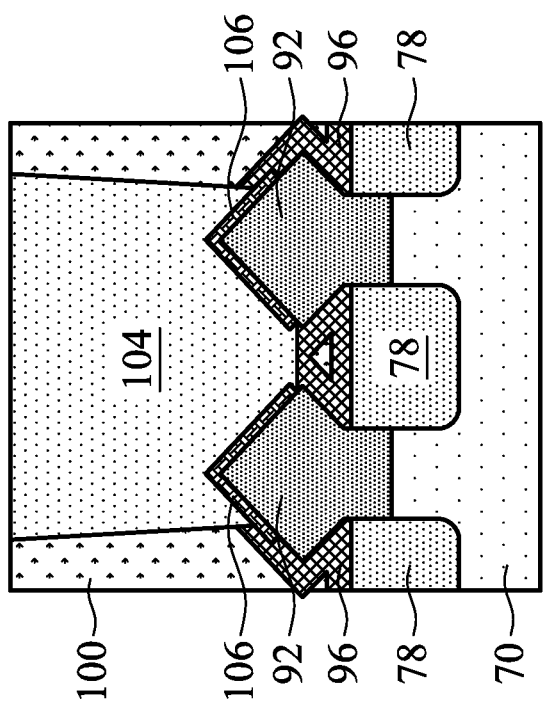
FIG. 5A
FIG. 5B

LOW-K FEATURE FORMATION PROCESSES AND STRUCTURES FORMED THEREBY

PRIORITY CLAIM AND CROSS-REFERENCE

This application is a continuation of U.S. patent application Ser. No. 15/994,561, filed on May 31, 2018, entitled "Low-k Feature Formation Processes and Structures Formed Thereby," which application claims the benefit of and priority to U.S. Provisional Patent Application No. 62/591,316, filed on Nov. 28, 2017, entitled "Low-k Feature Formation Processes and Structures Formed Thereby," which are incorporated herein by reference in their entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-C, 2A-B, 3A-B, 4A-B, and 5A-B are various views of respective intermediate structures at intermediate stages in an example process of forming a semiconductor device in accordance with some embodiments.

DETAILED DESCRIPTION

Figure 1A:
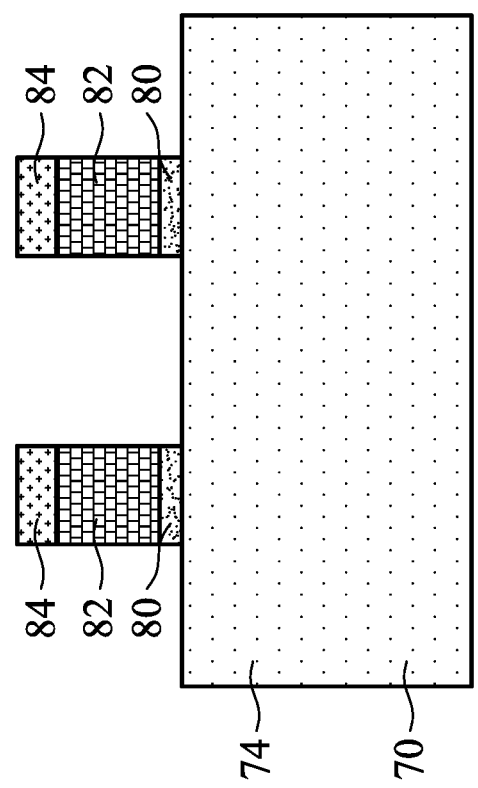

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device structures having low-k features and methods of forming low-k features are described herein. Low-k, as used herein, generally refers to a dielectric constant lower than silicon dioxide, such as lower than 4.2, and more particularly, 4.0 or lower. Various low-k features described herein may be implemented in a semiconductor device structure. Further, processes for forming low-k features can be implemented with other processes described herein or in other processes and/or contexts. Some aspects of embodiments described herein can enhance a device's performance by lowering a k-value in the device, thereby lowering the resistance-capacitance (RC) delay value of the device. Other advantages may be achieved.

In some embodiments, the low-k layer is a dielectric material including silicon-carbon. In some embodiments, the low-k layer has a k-value lower than 4.0. For example, the low-k layer has a k-value in a range from 3.0 to 4.0. In some embodiments, the k-value of the low-k layer is achieved by controlling the concentration of carbon. The concentration of carbon in the low-k layer can affect film density, which is related to k-value. For example, an increase in the concentration of carbon in the low-k layer may result in a decrease in density of the low-k layer, which may lead to a lowered k-value. A decrease in the concentration of carbon in the low-k layer may result in an increase in density of the low-k layer, which may lead to a raised k-value. In some embodiments, a low-k layer, such as in a dielectric film in a gate spacer structure, has a concentration of carbon in a range from greater than 0 atomic percent (at. %) to about 30 at. %.

The low-k layer can be formed using an atomic layer deposition (ALD) process by alternately pulsing a silicon-carbon source precursor and an oxygen source precursor. The concentration of carbon in the low-k layer can be controlled by adjusting the composition of the silicon-carbon source precursor, flow rates of precursors, and/or durations of operations of the ALD cycle. The silicon-carbon source precursor may include a molecular structure having one or more carbon atoms between two silicon atoms. In some embodiments, the concentration of carbon may be controlled by selecting a silicon-carbon source precursor composition having more or less carbon relative to silicon. In some embodiments, the concentration of carbon may be controlled by selecting a higher or lower flow ratio between the silicon-carbon source precursor and another precursor (e.g., an oxygen source precursor).

In some embodiments, a low-k layer, such as in a gate spacer structure, has a concentration of nitrogen that is less than 5 at. % at any instance in the low-k layer. For example, the concentration of nitrogen in the lower-k layer may be in the range from 0 to about 3 at. %.

The foregoing broadly outlines some aspects of embodiments described herein. Some embodiments described herein are described in the context of Fin Field Effect Transistors (FinFETs) with certain aspects combined in some embodiments so that those aspects may be clearly, yet briefly, described. Various aspects can be implemented without other aspects described herein. Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1A-C through 5A-B are views of respective intermediate structures at intermediate stages in an example process of forming a semiconductor device in accordance with some embodiments. Particularly, FIGS. 1A-C through 5A-B describe stages of forming FinFET structures with a gate-first process. FIGS. 1A-C through 4A-B and 6A-B illustrate further aspects of a replacement gate process as described herein.

Figure 1B:
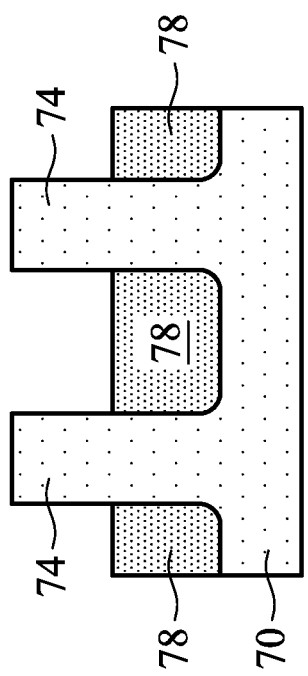
Figure 1C:
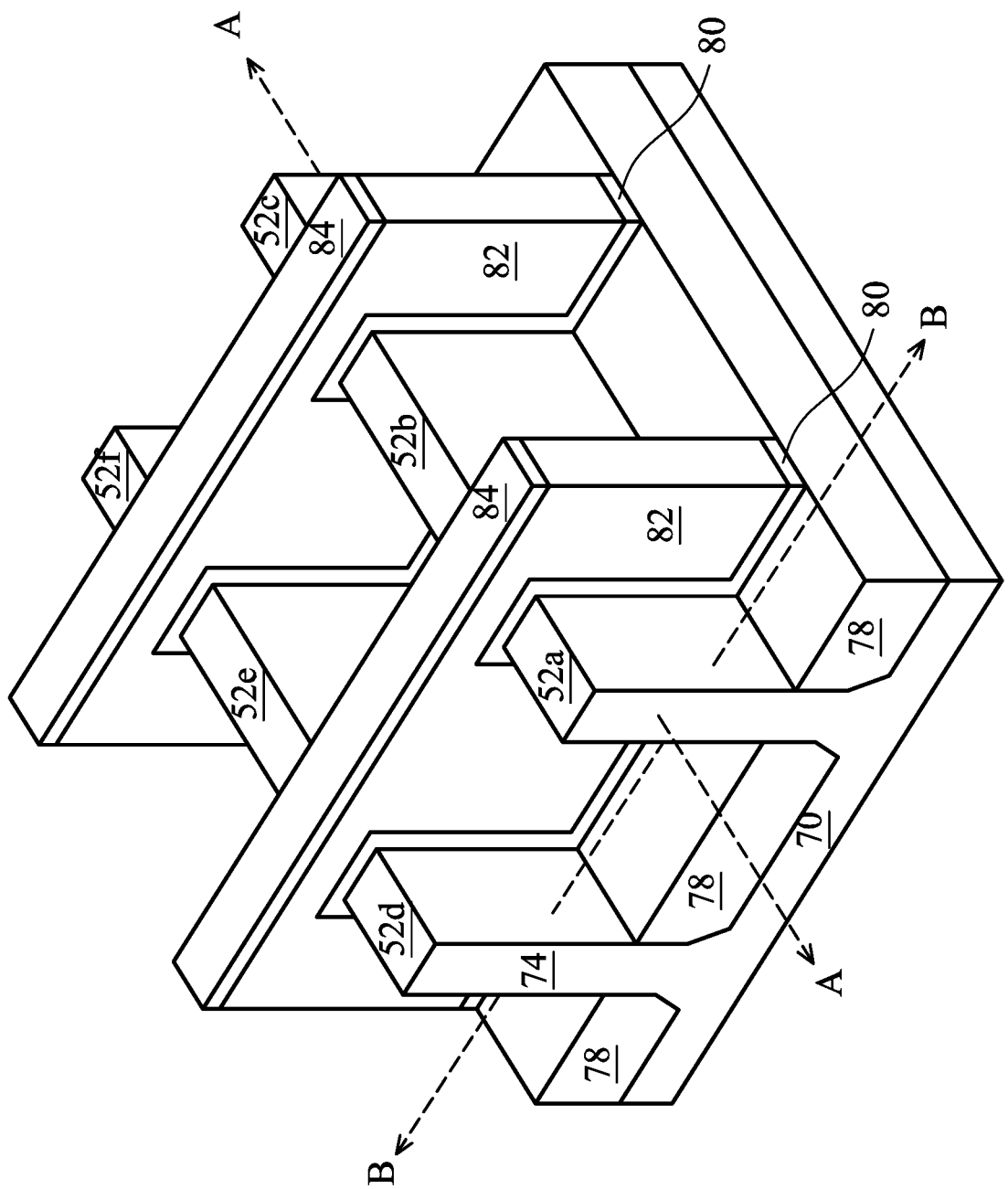

FIGS. 1A, 1B, and 1C illustrate different views of an intermediate structure at a stage in an example process of forming a semiconductor device in accordance with some embodiments. FIGS. 1A and 1B are different cross-sectional views of the intermediate structure, and FIG. 1C is a perspective view of the intermediate structure.

Fins 74 are on a semiconductor substrate 70. Isolation regions 78 are on the semiconductor substrate 70 and are disposed between neighboring fins 74. The fins 74 each protrude above and from between neighboring isolation regions 78. Gate stacks (or more generically, gate structures), with each including a dielectric layer 80, a gate layer 82, and a mask 84, are formed along sidewalls and over top surfaces of the fins 74. Source/drain regions 52a-f are disposed in respective regions of the fins 74.

FIG. 1C further illustrates reference cross-sections that are used in other figures. Cross-section A-A is in a plane along, e.g., channels in one fin 74 between opposing source/drain regions 52a-c. Cross-section B-B is in a plane perpendicular to cross-section A-A and is across source/drain region 52a and source/drain region 52d in neighboring fins 74. The figures ending with an "A" designation illustrate cross-sectional views at various instances of processing corresponding to cross-section A-A, and the figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

The semiconductor substrate 70 may be or include a bulk semiconductor substrate, a semiconductor-on-insulator (SOI) substrate, or the like, which may be doped (e.g., with a p-type or an n-type dopant) or undoped. The semiconductor material of the semiconductor substrate 70 may include an elemental semiconductor including silicon (Si) or germanium (Ge); a compound semiconductor; an alloy semiconductor; or a combination thereof.

The fins 74 may be formed from the semiconductor substrate 70, such as by etching trenches between the fins 74. The isolation regions 78 may be formed in the trenches between the fins 74. The isolation regions 78 may include or be an insulating material such as an oxide (such as silicon oxide), a nitride, the like, or a combination thereof. The fins 74 protrude from between neighboring isolation regions 78, which may, at least in part, thereby delineate the fins 74 as active areas on the semiconductor substrate 70. The fins 74 and isolation regions 78 may be formed by any acceptable processes and can include any acceptable material. In some examples, the fins 74 may include heteroepitaxial structures (e.g., a material lattice-mismatched to the semiconductor material of the semiconductor substrate 70) or other structures.

The gate stacks are over and extend laterally perpendicularly to the fins 74. The gate stacks can be operational gate stacks in a gate-first process or can be dummy gate stacks in a replacement gate process. The dielectric layer 80, gate layer 82, and mask 84 for the gate stacks may be formed by sequentially forming respective layers by appropriate process, and then patterning those layers into the gate stacks by appropriate photolithography and etching processes.

In a gate-first process, the dielectric layer 80 may be a gate dielectric, and the gate layer 82 may be a gate electrode. For example, the gate dielectrics may include or be silicon oxide, silicon nitride, a high-k dielectric material, the like, or multilayers thereof. A high-k dielectric material can have a k value greater than about 7.0, and may include a metal oxide or silicate of Hf, Al, Zr, La, Mg, Ba, Ti, Pb, multilayers thereof, or a combination thereof. The gate electrodes may include or be silicon (e.g., polysilicon, which may be doped or undoped), a metal-containing material (such as titanium, tungsten, aluminum, ruthenium, or the like), or a combination thereof (such as a silicide or multiple layers thereof). The mask 84 may include or be silicon nitride, silicon oxynitride, silicon carbon nitride, the like, or a combination thereof In a replacement gate process, the dielectric layer 80 may be an interfacial dielectric, and the gate layer 82 may be a dummy gate. For example, the interfacial dielectrics may include or be silicon oxide, silicon nitride, the like, or multilayers thereof. The dummy gates may include or be silicon (e.g., polysilicon) or another material. The mask 84 may include or be silicon nitride, silicon oxynitride, silicon carbon nitride, the like, or a combination thereof.

FIGS. 2A and 2B illustrate the formation of a first gate spacer layer 86 and a low-k gate spacer layer 88 along sidewalls and top surfaces of the gate stacks and the fins 74. The first gate spacer layer 86 is conformally deposited along sidewalls and top surfaces of the fins 74 and gate stacks (e.g., along sidewalls of dielectric layers 80, gate layers 82, and masks 84, and on top surfaces of masks 84), and on top surfaces of the isolation regions 78. The first gate spacer layer 86 can be or comprise silicon oxyncarbonitride (Si-$O_xCN_y$) or another material. In some examples, the first gate spacer layer 86 can be deposited using an ALD process, although other deposition techniques can be used. In some embodiments, the first gate spacer layer 86 may be omitted.

In embodiments implementing the first gate spacer layer 86, the low-k gate spacer layer 88 is conformally deposited on the first gate spacer layer 86. In embodiments omitting the first gate spacer layer 86, the low-k gate spacer layer 88 is conformally deposited along sidewalls and top surfaces of the fins 74 and gate stacks (e.g., along sidewalls of dielectric layers 80, gate layers 82, and masks 84), and on top surfaces of masks 84), and on top surfaces of the isolation regions 78. In some embodiments, conformity of the low-k gate spacer layer 88 may be measured by a ratio of a thickness along a vertical wall, such as thickness 88b on sidewalls of the gate stack, to thickness on a horizontal plane, such as thickness 88a over the top surface of the gate stack. In an embodiment, conformity of the low-k gate spacer layer 88 is greater than 95%, such as in a range from about 95% to about 105%.

The low-k gate spacer layer 88 is a dielectric layer including silicon-carbon. In some embodiments, the low-k gate spacer layer 88 can be or comprise silicon oxycarbide (SiOC) or another material. In some examples, the low-k gate spacer layer 88 can be deposited using an ALD process, although other deposition techniques can be used. In some embodiments, the low-k gate spacer layer 88 has a k-value lower than 4.0. For example, the low-k gate spacer layer 88 has a k-value in a range from 3.0 to 4.0. In some embodiments, the k-value of the low-k gate spacer layer 88 is achieved by controlling the concentration of carbon in the low-k gate spacer layer 88. In some embodiments, the low-k gate spacer layer 88 has a concentration of carbon in a range from greater than 0 at. % to about 30 at. %. A higher concentration of carbon may result a film of lower density and lower k-value. In some embodiments, the low-k gate spacer layer 88 has a density in a range from 1.0 g/cm$^3$ to 3.0 g/cm$^3$, for example about 1.8 g/cm$^3$.

In some embodiments that implement an ALD process for depositing the low-k gate spacer layer 88, the low-k gate spacer layer 88 can be formed by alternately pulsing a silicon-carbon source precursor and an oxygen source precursor. The concentration of carbon in the low-k gate spacer layer 88 can be controlled by adjusting the composition of the silicon-carbon source precursor, flow rates of precursors, and/or durations of operations of the ALD cycle. The silicon-carbon source precursor may include a molecular structure having one or more carbon atoms between two silicon atoms. In some embodiments, the concentration of carbon may be controlled by selecting a silicon-carbon source precursor composition having more or less carbon relative to silicon. In some embodiments, the concentration of carbon may be controlled by selecting a higher or lower flow ratio between the silicon-carbon source precursor and the oxygen source precursor.

In some embodiment, the precursors used in the ALD process to form the low-k gate spacer layer 88 do not include nitrogen resulting in a film that has a low nitrogen concentration. In some embodiments, the low-k gate spacer layer 88 has a concentration of nitrogen that is less than 3 at. % at any instance in the low-k gate spacer layer 88. For example, the concentration of nitrogen in the low-k gate spacer layer 88 may be in the range from 0 to about 3 at. %. The low concentration of nitrogen results in a low-k value.

Additional details of examples of the low-k gate spacer layer 88 and ALD processes for forming those examples of the low-k gate spacer layer 88 are described below with respect to FIGS. 8 and 9.

Figure 3A:
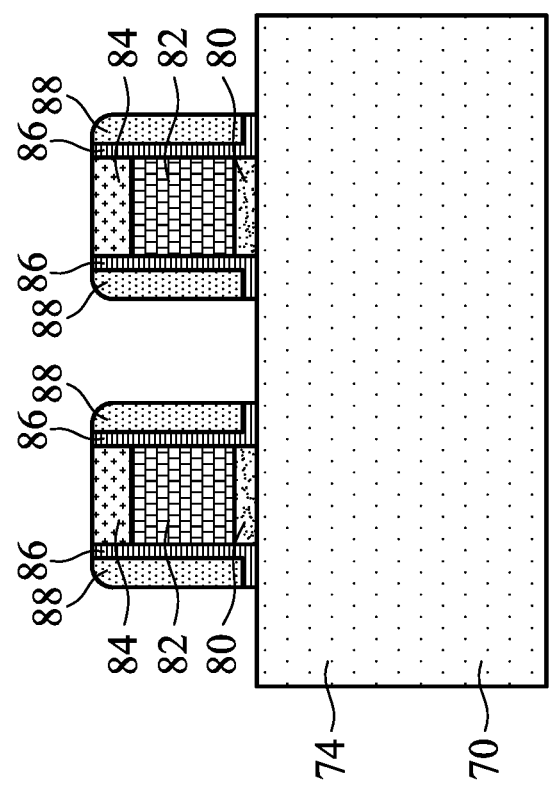
Figure 3B:
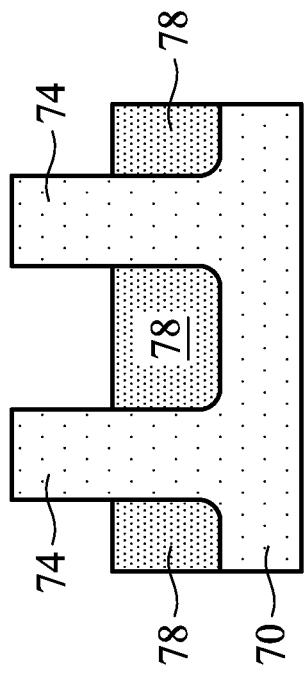

FIGS. 3A and 3B illustrate the formation of gate spacers. Gate spacers (e.g., bi-layer gate spacers, as illustrated) are formed along sidewalls of the gate stacks (e.g., sidewalls of the dielectric layer 80, gate layer 82, and masks 84) and over the fins 74. The gate spacers may be formed by anisotropically etching the low-k gate spacer layer 88 and the first gate spacer layer 86. The etch process can include a RIE, NBE, or another etch process. The multi-layer gate spacers may include additional and/or different layers and/or materials in other embodiments. Further, residual gate spacers may also be formed along sidewalls of the fins 74 as a result of the deposition of the low-k gate spacer layer 88 and the first gate spacer layer 86 and subsequent anisotropic etching of those layers to form the gate spacers.

Figure 4B:
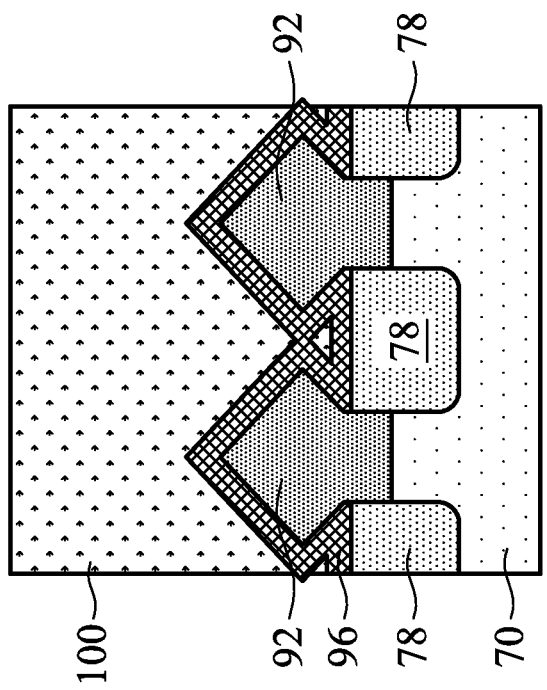
Figure 4A:
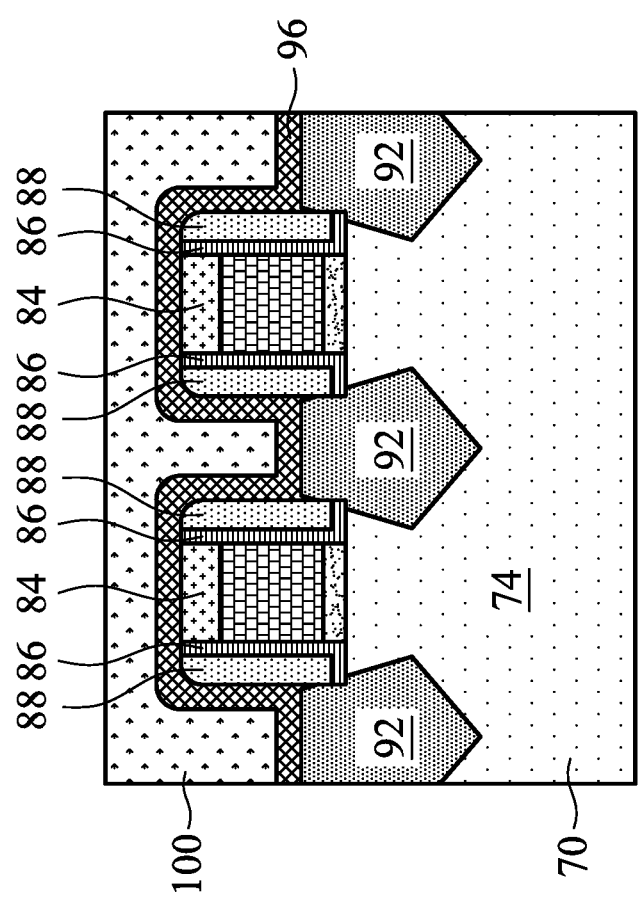

FIGS. 4A and 4B illustrate the formation of epitaxy source/drain regions 92, a contact etch stop layer (CESL) 96, and a first interlayer dielectric (ILD) 100. Recesses are first formed in the fins 74 on opposing sides of the gate stacks prior to formation of the epitaxy source/drain regions 92. The recessing can be implemented by an etch process. The recesses can have various cross-sectional profiles based on the etch process implemented. Epitaxy source/drain regions 92 are formed in the recesses. The epitaxy source/drain regions 92 may include or be silicon germanium, silicon carbide, silicon phosphorus, pure or substantially pure germanium, a III-V compound semiconductor, a II-VI compound semiconductor, or the like. The epitaxy source/drain regions 92 may be formed in the recesses by epitaxially growing a material in the recesses by an appropriate deposition process. In some examples, the epitaxy source/drain regions 92 may be formed raised with respect to the fins 74 and may be formed with facets, which may correspond to crystalline planes of the semiconductor substrate 70.

In some examples, source/drain regions may be formed by implanting dopants into the fins 74 using the gate stacks and multi-layer gate spacers as masks. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

After formation of the source/drain regions 92, the CESL 96 is formed. Generally, an etch stop layer can provide a mechanism to stop an etch process when forming, e.g., contacts or vias by having a different etch selectivity from adjacent layers or components. The CESL 96 is conformally deposited on surfaces of the epitaxy source/drain regions 92, sidewalls and top surfaces of the multi-layer gate spacers, top surfaces of the mask 84, and top surfaces of the isolation regions 78. The CESL 96 may comprise or be silicon nitride, silicon carbon nitride, silicon oxycarbide, silicon oxycarbonitride, the like, or a combination thereof.

The first interlayer dielectric (ILD) 100 is then formed over the CESL 96. The first ILD 100 may comprise or be silicon dioxide, a low-k dielectric material, such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The first ILD 100 may be deposited by any appropriate deposition technique.

The first ILD 100 may be planarized after being deposited, such as by a chemical mechanical planarization (CMP). In a gate-first process, a top surface of the first ILD 100 may be above the upper portions of the CESL 96 and the gate stacks. Hence, the upper portions of the CESL 96 may remain over the gate stacks.

FIGS. 5A and 5B illustrate the formation of conductive features 104 to the epitaxy source/drain regions 92. Openings are first formed through the first ILD 100 and the CESL 96 to the epitaxy source/drain regions 92 to expose at least portions of the epitaxy source/drain regions 92. The first ILD 100 and the CESL 96 may be patterned with the openings, for example, using photolithography and one or more etch processes. The conductive features 104 may include an adhesion and/or barrier layer and conductive material on the adhesion and/or barrier layer, for example. In some examples, the conductive features 104 may include silicide regions 106 on the epitaxy source/drain regions 92, as illustrated. The adhesion and/or barrier layer can be conformally deposited in the openings and over the first ILD 100. The adhesion and/or barrier layer may be or comprise titanium, titanium nitride, titanium oxide, tantalum, tantalum nitride, tantalum oxide, the like, or a combination thereof. Silicide regions 106 may be formed on upper portions of the epitaxy source/drain regions 92 by reacting upper portions of the epitaxy source/drain regions 92 with the adhesion and/or barrier layer. An anneal process can be performed to facilitate the reaction of the epitaxy source/drain regions 92 with the adhesion and/or barrier layer.

The conductive material can be deposited on the adhesion and/or barrier layer and fill the openings. The conductive material may be or comprise tungsten, copper, aluminum, gold, silver, alloys thereof, the like, or a combination thereof. After the material of the conductive features 104 is deposited, excess material may be removed by using a planarization process, such as a CMP, for example. The planarization process may remove excess material of the conductive features 104 from above a top surface of the first ILD 100. Hence, top surfaces of the conductive features 104 and the first ILD 100 may be coplanar. The conductive features 104 may be or may be referred to as contacts, plugs, etc.

Figure 6A:
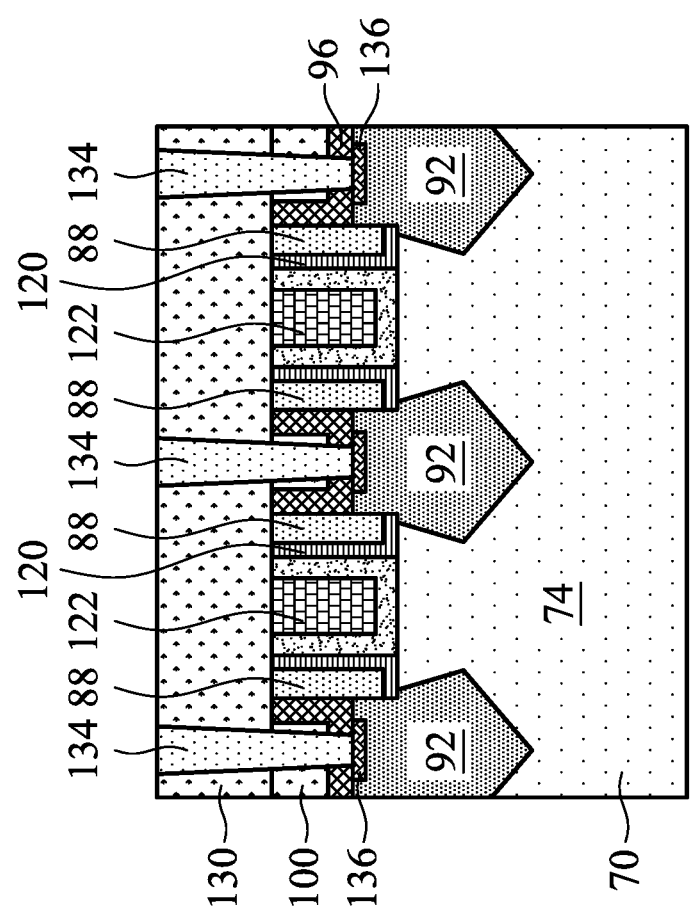
FIGS. 6A-B are cross-sectional views of an intermediate structure at an intermediate stage in another example process of forming a semiconductor device in accordance with some embodiments.
Figure 6B:
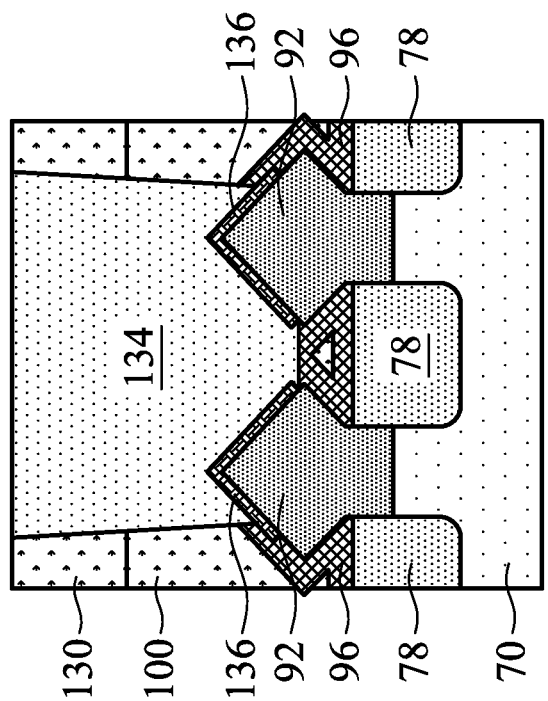

FIGS. 6A and 6B are cross-sectional views of an intermediate structure at an intermediate stage in another example process of forming a semiconductor device in accordance with some embodiments. FIGS. 6A-B illustrate further aspects of a replacement gate process as described herein. Processing is first performed as described above with respect FIGS. 1A-C through 4A-B and then proceeds to FIGS. 6A-B.

In a replacement gate process, the first ILD 100 and CESL 96 are formed with top surfaces coplanar with top surfaces of the gate layers 82 to expose the gate layers 82 through the first ILD 100 and the CESL 96. A planarization process, such as a CMP, may be performed to level the top surface of the first ILD 100 and CESL 96 with the top surfaces of the gate layers 82, which may also remove the mask 84 (and, in some instances, upper portions of the multi-layer gate spacers).

With the gate layers 82 exposed through the first ILD 100 and the CESL 96, the gate layers 82 and the dielectric layers 80 are removed, such as by one or more etch processes. The gate layers 82 may be removed by an etch process selective to the gate layers 82, wherein the dielectric layers 80 act as etch stop layers, and subsequently, the dielectric layers 80 can be removed by a different etch process selective to the dielectric layers 80. Recesses are formed between multi-layer gate spacers where the gate stacks are removed, and channel regions of the fins 74 are exposed through the recesses.

The replacement gate structures are formed in the recesses formed where the gate stacks were removed. The replacement gate structures each include one or more conformal layers 120 and a gate conductive fill material 122. The one or more conformal layers 120 include a gate dielectric layer and may include one or more work-function tuning layers.

The gate dielectric layer can be conformally deposited in the recesses where gate stacks were removed (e.g., on top surfaces of the isolation regions 78, sidewalls and top surfaces of the fins 74 along the channel regions, and sidewalls of the multi-layer gate spacers) and on the top surfaces of the first ILD 100, the CESL 96, and multi-layer gate spacers. The gate dielectric layer can be or include silicon oxide, silicon nitride, a high-k dielectric material (examples of which were described above), multilayers thereof, or other dielectric material.

Then, if implemented, a work-function tuning layer may be conformally deposited on the gate dielectric layer. The work-function tuning layer may include or be tantalum, tantalum nitride, titanium, titanium nitride, the like, or a combination thereof. Any additional work-function tuning layers may be sequentially deposited similar to the first work-function tuning layer.

The gate conductive fill material 122 is formed over the one or more conformal layers 120. The gate conductive fill material 122 can fill remaining recesses where the gate stacks were removed. The gate conductive fill material 122 may be or comprise a metal-containing material such as Co, Ru, Al, W, Cu. multi-layers thereof, or a combination thereof.

Portions of the gate conductive fill material 122 and of the one or more conformal layers 120 above the top surfaces of the first ILD 100, the CESL 96, and multi-layer gate spacers are removed, such as by a planarization process, like a CMP. The replacement gate structures comprising the gate conductive fill material 122 and one or more conformal layers 120 may therefore be formed as illustrated in FIG. 6A.

A second ILD 130 is formed over the first ILD 100, replacement gate structures, multi-layer gate spacers, and CESL 96. The second ILD 130 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

Conductive features 134 are then formed through the second ILD 130, first ILD 100, and CESL 96 to the epitaxy source/drain regions 92, which may further form silicide regions 136 on the epitaxy source/drain regions 92. The conductive features 134 and silicide regions 136 may be formed similarly as the conductive features 104 and silicide regions 106 as described above with respect to FIGS. 5A-B.

Figure 7:
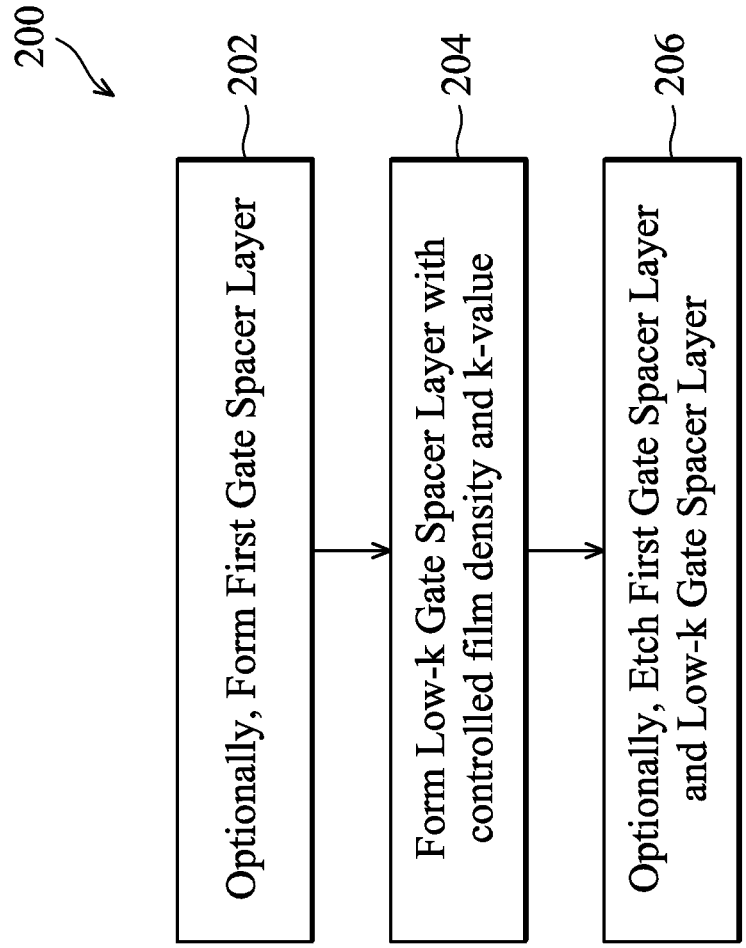
FIG. 7 is a process flow for forming a gate spacer in accordance with some embodiments.

FIG. 7 is a process flow 200 for forming a gate spacer in accordance with some embodiments. In operation 202, optionally, a first gate spacer layer is formed on a device structure, such as generally illustrated in and described with respect to FIGS. 2A and 2B. This operation 202 may be omitted. In operation 204, a low-k gate spacer layer is formed using a process that is capable of controlling film density to achieve a desired k-value. The film density may be controlled by controlling the concentration of carbon in the low-k gate spacer layer. The low-k gate spacer layer may be formed on the first gate spacer layer, if optionally implemented, or on the device structure. Generally, the formation of the low-k gate spacer layer is illustrated in and described with respect to FIGS. 2A and 2B. In operation 206, the low-k gate spacer layer and, if implemented, the first gate spacer layer are anisotropically etched to form the gate spacer, such as generally illustrated in and described with respect to FIGS. 3A and 3B.

Figure 8:
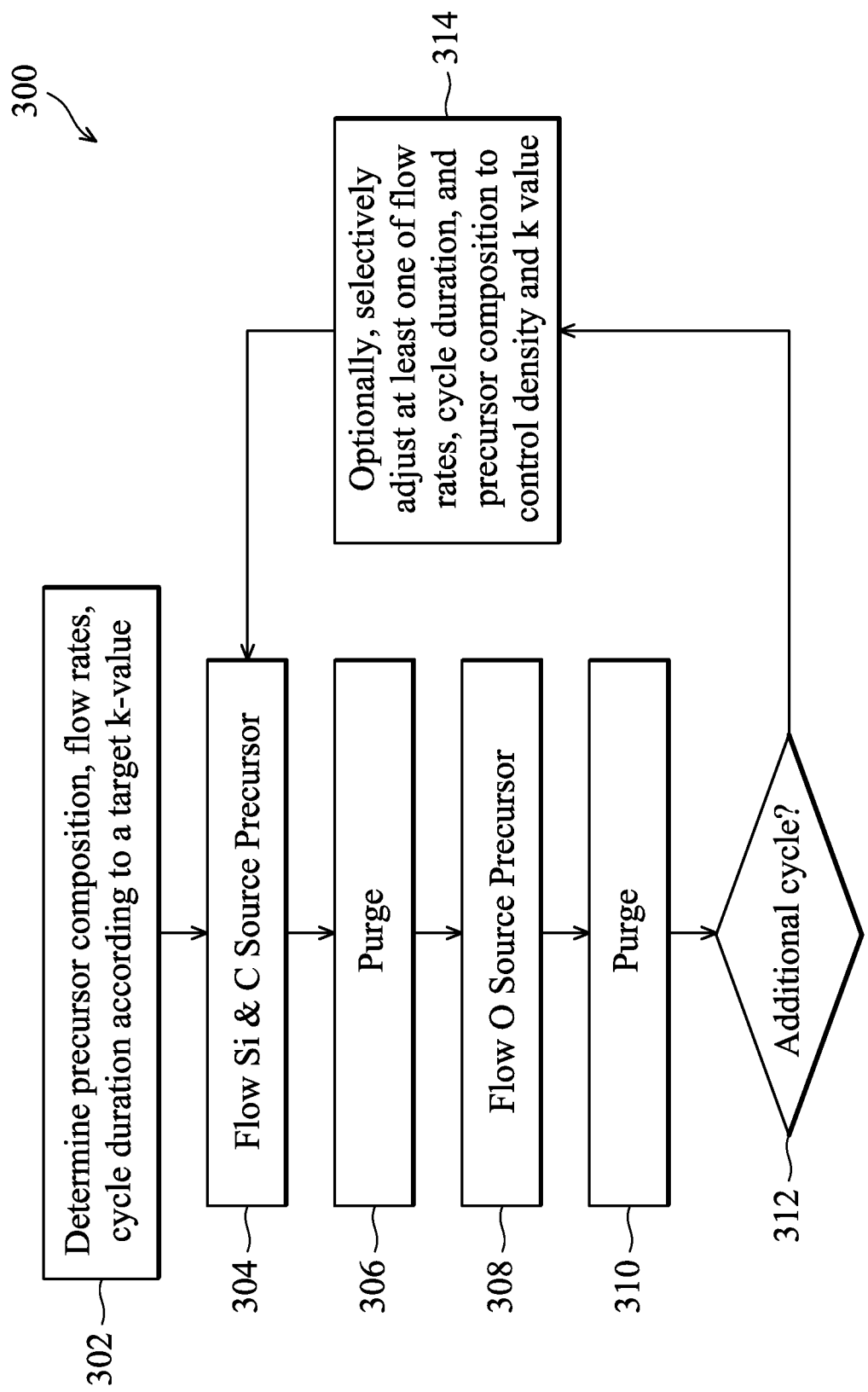
FIG. 8 is process flow for forming a low-k material by controlling a carbon concentration in accordance with some embodiments.

FIG. 8 is a process flow 300 for forming a low-k dielectric film, such as the low-k gate spacer layer 88, in accordance with some embodiments. The process flow 300 may be used to form the low-k gate spacer layer in operation 204.

The process flow 300, in this example, is an ALD process. The low-k film formed by the process flow 300 can be or comprise silicon oxycarbide (SiOC) or another material, with varying concentrations of carbon. The low-k film in process flow 300 may be formed by alternately flowing a silicon-carbon source precursor and an oxygen source precursor. The concentration of carbon may be used to control density of the low-k film and achieve the target k value of the low-k film. The carbon concentration in the film may be varied by adjusting compositions of the precursors, the flow rates of the precursors, and/or cycle durations of each precursor.

In operation 302, initial process parameters are determined to achieve a target k value of the low-k film. The target k value may be achieved by controlling the carbon concentration in the film. According to some embodiments of the present disclosure, one or more of precursor compositions, flow rates, and cycle durations may be used as variables to achieve the target k-value.

Precursors for Forming the Low-k Film

In some embodiments, the low-k film may be formed by an ALD process using a silicon-carbon source precursor and an oxygen source precursor. The silicon-carbon source precursor may include a chemical structure having one or more carbon atom bonding with two silicon atoms, which is a three dimensional structure allowing formation of pores on a substrate surface. The oxygen source precursor may include steam ($H_2O$), oxygen gas ($O_2$), and/or similar. The oxygen source precursor may react with the silicon-carbon compounds on the substrate surface and may result in a low-k film including silicon oxycarbide.

In some embodiments, the silicon-carbon source precursor may include a generic chemical structure having one or more H-functional (H—C—H) groups bonded between two silicon atoms. Equation 1 is a chemical formula of an exemplary silicon-carbon source precursor.

Equation 1:

Wherein n can be an integer in the range from 1 to 3, and Lg denotes a halogen element, such as chlorine. The silicon-carbon source precursor may include bis(trichlorosilyl) methane, i.e., $(SiCl_3)_2CH_2$, having a chemical structure shown in Equation 2.

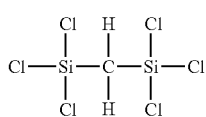

Equation 2

The silicon-carbon source precursor may include 1,1,3,3-tetrachloro-1,3-disiletane, i.e., $(SiCl_2)_2(CH_2)_2$, having a chemical structure shown in Equation 3.

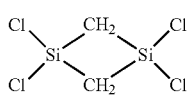

Equation 3

The silicon-carbon source precursor may include 1,3-dicholoro-1,3-disilabicyclo [1,1,1]pentane, i.e., $(SiCl)_2(CH_2)_3$, having a chemical structure shown in Equation 4.

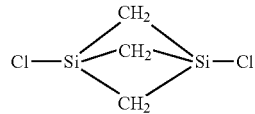

Equation 4

In some embodiments, the silicon-carbon source precursor may include a generic chemical structure having one or more carbon atoms bonded between two silicon atoms. For example, the silicon-carbon source precursor may include bis(dichlorosilylidene)methane, i.e., $C(SiCl_2)_2$, having a chemical structure shown in Equation 5.

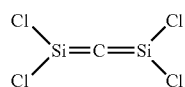

Equation 5

The silicon-carbon source precursor may include one or more of the above chemicals. For example, the silicon-carbon source precursor may include 100% $(SiCl_3)_2CH_2$ so that the ratio of carbon to silicon in the precursor is 1:2. In some embodiments, the silicon-carbon source precursor may include $(SiCl_3)_2CH_2$ and at least one of $(SiCl_2)_2(CH_2)_2$, $(SiCl)_2(CH_2)_3$, or $C(SiCl_2)_2$ to increase the ratio of carbon to silicon in the precursor. For example, in an embodiment, the silicon-carbon source precursor may include $(SiCl_3)_2CH_2$ in a range from 30% to 70% in molecular concentration, and as a remainder of the silicon-carbon source precursor, may include $(SiCl_2)_2(CH_2)_2$ in a range from 70% to 30% (respectively) in molecular concentration. Assuming other parameters are equal, a higher carbon to silicon ratio in the precursor may result in a higher carbon concentration in the low-k film.

In some embodiments, the silicon-carbon source precursor may include a silicon compound without carbon in addition to a chemical according to equation 1 to lower a carbon to silicon ratio, which may achieve a higher film density and a higher k-value. In an embodiment, the silicon compound without carbon may be $Si_2Cl_6$ or others. For example, the silicon-carbon source precursor may include $(SiCl_3)_2CH_2$ in a range from 30% to 70% in molecular concentration, and as a remainder of the silicon-carbon source precursor, may include hexachlorodisilane ($Si_2Cl_6$) in a range from 70% to 30% (respectively) in molecular concentration. Assuming other parameters are equal, a higher concentration of hexachlorodisilane in the silicon-carbon source precursor may result in a lower carbon concentration, which may achieve a higher density and a higher k-value in the low-k film.

Precursor Composition as Variable

In some embodiments, composition of the silicon-carbon source precursor may be selected according to the target k-value. For example, the silicon-carbon source precursor can include a chemical compound having a generic chemical structure having a carbon atom or carbon functional group bonded between two silicon atoms, such as $(SiCl_3)_2CH_2$, $(SiCl_2)_2(CH_2)_2$, $(SiCl)_2(CH_2)_3$, and $C(SiCl_2)_2$. In an embodiment, a ratio of carbon to silicon in the composition of the silicon-carbon source precursor may be increased to achieve a lowered k-value in the target film. In an embodiment, the ratio of carbon to silicon may be increased by adding $(SiCl_2)_2(CH_2)_2$ and/or $(SiCl)_2(CH_2)_3$ to $(SiCl_3)_2CH_2$.

On the other hand, a carbon to silicon ratio may be lower to achieve an increased k-value in the target film. In some embodiments, the silicon-carbon source precursor may further include a silicon compound without carbon. For example, the ratio of carbon to silicon may be lowered by adding $Si_2Cl_6$ to $(SiCl_3)_2CH_2$.

Ratio of Oxygen Source and Silicon-Carbon Source as Variable

In some embodiments, the target k-value may be achieved by selecting a ratio of the amount of oxygen source precursor over the amount of the silicon-carbon source precursor supplied during each cycle. During the ALD process, an amount of silicon-carbon source precursor may be supplied to the process chamber so that a monolayer of material, such as a single layer of atoms and/or molecules including a chemical structure like —Si—$CH_2$—Si—, forms on the surface of the substrate being processed. A catalyst (such as pyridine) may be supplied with the silicon-carbon source precursor to react with the precursor and form the monolayer of material. Next, an amount of oxygen source precursor is supplied to the process chamber so that oxygen is reacted with the monolayer of material. For example, a catalyst (such as pyridine) can react with the oxygen source precursor (such as steam ($H_2O$)) to form a hydroxide group (—OH) that reacts with and terminates the monolayer. By increasing a ratio of the amount of oxygen source precursor over the amount of the silicon-carbon source precursor (e.g., increasing the flow rate of the oxygen source precursor), more of the oxygen source precursor may react with more available reaction sites (e.g., until saturation is reached) to increase the concentration of oxygen in the formed film, and thereby decrease the concentration of carbon. Hence, the k-value of the film can be increased. Conversely, decreasing the ratio can decrease the k-value.

Accordingly, changing the ratio of silicon-carbon source to oxygen source during the ALD process (e.g., between cycles) may change the k-value in the target film. For example, a higher ratio of silicon-carbon source to oxygen source may result in a lower k-value while a lower ratio of silicon-carbon source to oxygen source may result in a higher k-value. In other embodiments, when the amount of oxygen source remains unchanged, increasing or lowering the silicon-carbon source is used to lower or increase target k-value in the low-k film.

The amount of precursor supplied in each cycle may be adjusted by increasing/reducing the flow rate while the cycle time remains constant, increasing/reducing cycle time while the flow rate remains constant, or adjusting the flow rate and cycle time at the same time.

In operation 302, the initial value of composition, flow rates, and cycle duration may be selected to achieve a target k-value. For example, to achieve a target k-value of about 4.1, the composition of the silicon-carbon source precursor may include 100% $(SiCl_3)_2CH_2$, and the oxygen source may include steam ($H_2O$).

Operations 304 through 310 illustrate a cycle of the ALD process. The cycle includes alternating flow (or pulse) and purge operations, where each precursor is flowed (or pulsed) and subsequently purged at least once during the cycle. In operation 304, the silicon-carbon source precursor is flowed in an ALD tool chamber into which the substrate (e.g., on which the device structure is formed, e.g., as illustrated in FIGS. 1A-C) is transferred, and subsequently, in operation 306, the silicon-carbon source precursor is purged from the ALD tool chamber. In some examples, the silicon-carbon source precursor may react with reaction sites available on the substrate before being purged. The reactions may saturate the reaction sites, or the silicon-carbon source precursor may not react with some reaction sites available on the substrate, in some examples. In some examples, a catalyst, such as pyridine ($C_5H_5N$) is flowed in the ALD tool chamber in operation 304 to boost the reaction. Similarly, in operation 308, the oxygen source precursor is flowed in the ALD tool chamber, and subsequently, in operation 310, the oxygen source precursor is purged from the ALD tool chamber. In some examples, the oxygen source precursor may react with reaction sites available on the substrate before being purged. The reactions may saturate the reaction sites, or the oxygen source precursor may not react with some reaction sites available on the substrate, in some examples.

After operation 310, a determination is made, in operation 312, whether additional cycles are to be performed. If so, another cycle is performed. Any number of cycles can be performed to deposit a low-k gate spacer layer with a desired thickness.

Figure 9:
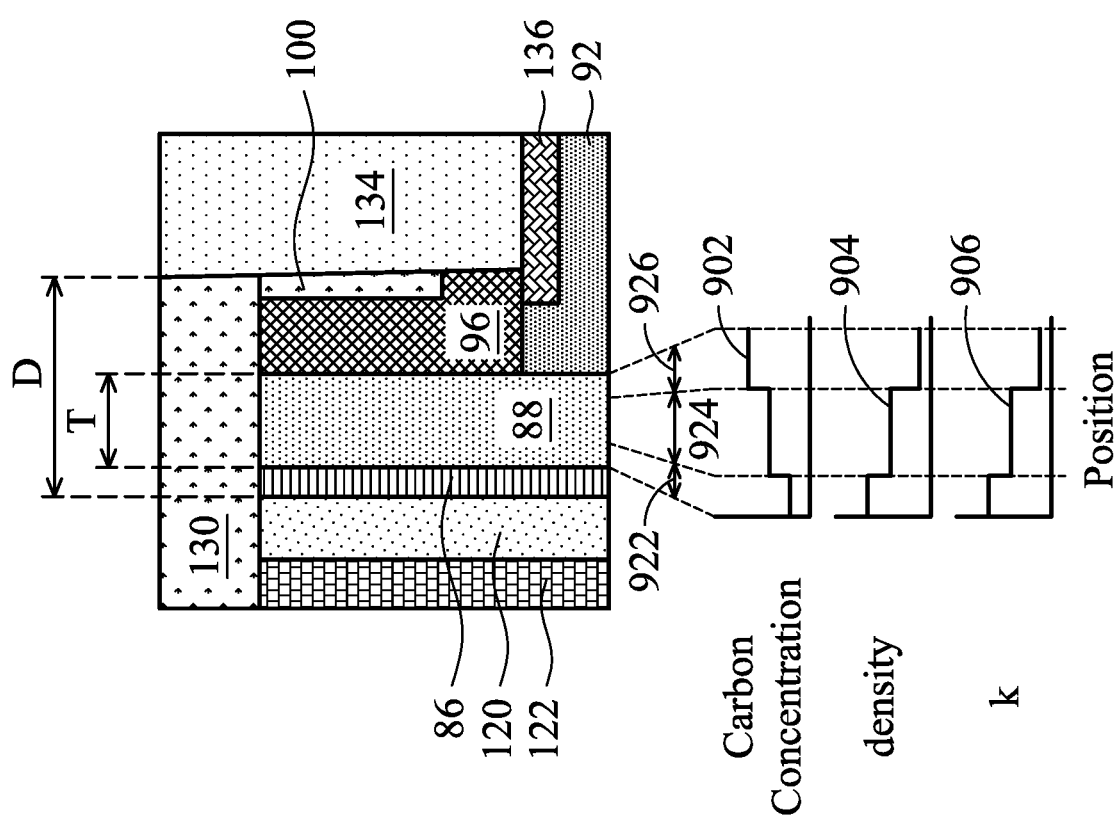
FIG. 9 is a cross-sectional view of a portion of the intermediate structure of FIG. 6A to illustrate additional details of a low-k gate spacer layer formed according to the process flow of FIG. 8 in accordance with some embodiments.

FIG. 9 illustrates a cross-sectional view of a portion of the intermediate structure of FIG. 6A to illustrate additional details of a low-k gate spacer layer 88 formed according to the process flow 300 of FIG. 8 in accordance with some embodiments. The low-k gate spacer layer 88 has a carbon concentration profile 902, a density value profile 904, and a k-value profile 906. In some examples, the carbon concentration 902 in the low-k gate spacer layer 88 is in the range from greater than 0 at. % to about 30 at. %.

In some examples, the ALD process of the process flow 300 of FIG. 8 can be performed in a range from 25 cycles to 175 cycles, such as 70 cycles. In some examples, a thickness T of the low-k gate spacer layer 88 (e.g., in a direction perpendicular to the first gate spacer layer 86) can be in a range from about 10 Å to about 70 Å, such as about 40 Å. The thickness T of the low-k gate spacer layer 88 can be in a range from about 30 percent to about 40 percent, such as about 40 percent, of a dimension D between the sidewall of the replacement gate structure and a nearest surface of a conductive feature 134. Other numbers of cycles and/or different processes may be implemented to form a low-k gate spacer layer 88, and/or the low-k gate spacer layer 88 may have different thicknesses.

Returning to FIG. 8, when a determination that additional cycles are needed in operation 312, an optional operation 314 may be performed to adjust operation parameters to achieve a target k-value profile, such as the k-value profile 906 in the low-k gate spacer layer 88 as shown in FIG. 9. The composition of precursors, the flow rate, and/or cycle duration may be adjusted to increase or decrease the carbon concentration, which may adjust the density and k-value in the low-k film being formed. In some embodiments, the low-k gate spacer layer 88 may have a profile that decreases in a direction from the gate dielectric (e.g., of the one or more conformal layers 120) to the first ILD 100. FIG. 9 illustrates a k-value profile 906 that has a first k-value for a thickness 922, a second k-value for a thickness 924, and a third k-value for a thickness 926, wherein the first k-value is greater than the second k-value, and the second k-value is higher than the third k-value. The decreasing of k-value from the first k-value to the third k-value may be achieved by adjusting one or more process parameters in operation 314 to obtain an increasing carbon concentration profile 902, and thus, a decreasing density profile 904 and decreasing k-value profile 906. In an embodiment, the carbon concentration for thickness 922 may be in a range from 0 at. % to 5 at. %; the carbon concentration for thickness 924 may be in a range from 5 at. % to 10 at. %; and the carbon concentration for thickness 926 may be in a range from 10 at. % to 20 at. %. In an embodiment, the density for thickness 922 may be in a range from 2.0 g/cm$^3$ to 2.5 g/cm$^3$; the density for thickness 924 may be in a range from 1.8 g/cm$^3$ to 2.0 g/cm$^3$; and the density for thickness 926 may be in a range from 1.5 g/cm$^3$ to 1.8 g/cm$^3$. The k-value for thickness 922 may be in a range from 3.9 to 5.0; the k-value for thickness 924 may be in a range from 3.7 to 3.9; and the k-value for thickness 926 may be in a range from 3.0 to 3.7.

Alternatively, the operation 314 may be omitted and the carbon centration, the density and the k-value of the dielectric film remains substantially consistent through the thickness T. For example, the carbon concentration may be in a range from greater than 0 at. % to about 30 at. %, for example about 15 at. %; the density may be in a range from 1.5 g/cm$^3$ to 2.0 g/cm$^3$, for example about 1.8 g/cm$^3$; and the k-value may be in a range from 3.2 to 4.2, for example about 3.9.

Some embodiments may achieve advantages. For example, embodiments can be implemented to achieve a lower k value, such as k<4.0, in a semiconductor device, such as a FinFET. In a FinFET device, a low-k gate spacer according to embodiments can improve performance of the device by lowering the resistance-capacitance (RC) delay value of the device.

One embodiment of present disclosure provides a method including forming a low-k layer using an Atomic Layer Deposition (ALD) process. The ALD process comprising, for a cycle, flowing a silicon-carbon source precursor having a chemical structure comprising at least one carbon atom bonded between two silicon atoms, and repeating the cycle a number of times.

Another embodiment of the present disclosure provides a method comprising forming a low-k layer using an Atomic Layer Deposition (ALD) process. The ALD process comprising, for a cycle, flowing a silicon-carbon source precursor having a chemical structure comprising at least one carbon atom bonded between at least two silicon atoms, flowing an oxygen source precursor, wherein a composition of the silicon-carbon source precursor or a ratio of the silicon-carbon source precursor to the oxygen source precursor in the cycle is selected to control a carbon concentration in the low-k layer, and repeating the cycle a number of times.

Another embodiment of the present disclosure provides a structure comprising an active area on a substrate, the active area comprising a source/drain region, a gate structure over the active area, and a gate spacer along a sidewall of the gate structure, the gate spacer being disposed laterally between the gate structure and the source/drain region, the gate spacer comprising a low-k layer having a carbon concentration in a range from greater than 0 at. % to 30 at. % and a nitrogen concentration from 0 at. % to 3 at. %.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a low-k layer using an Atomic Layer Deposition (ALD) process, the ALD process comprising:
        for a cycle, flowing a silicon-carbon source precursor having a chemical structure comprising at least one carbon atom bonded between two silicon atoms and wherein each chemical bond of the two silicon atoms that are not bonded to the at least one carbon atom is bonded to a halogen element; and
        for the cycle, flowing an oxygen source precursor; and
        repeating the cycle at least one time, wherein a flow rate of the silicon-carbon source precursor is modified from a first cycle to a second cycle.

2. The method of claim 1, wherein the low-k layer has a carbon concentration in a range from greater than 0 atomic percent (at. %) to 30 at. %.

3. The method of claim 1, wherein the low-k layer has a nitrogen concentration less than about 3 at. %.

4. The method of claim 1, wherein neither the silicon-carbon source precursor nor the oxygen source precursor comprises nitrogen.

5. The method of claim 1, wherein a flow duration of the silicon-carbon source precursor is modified from a first cycle to a second cycle.

6. The method of claim 1, wherein the forming the low-k layer forms the low-k layer adjacent to a first spacer layer adjacent to a dummy gate.

7. A method comprising:
    forming a low-k layer using an Atomic Layer Deposition (ALD) process, the ALD process comprising:
        for a cycle, flowing a silicon-carbon source precursor having a chemical structure comprising at least one carbon atom bonded between at least two silicon atoms and halogen atoms filling the bonds of each of the at least two silicon atoms that are not bonded to the at least one carbon atom;
        flowing an oxygen source precursor, wherein a composition of the silicon-carbon source precursor or a ratio of the silicon-carbon source precursor to the oxygen source precursor in the cycle is selected to control a carbon concentration in the low-k layer; and
        repeating the cycle one or more times, wherein a first cycle of the repeating the cycle has a first flow rate of the oxygen source precursor and a second cycle of the repeating the cycle has a second flow rate of the oxygen source precursor different from the first flow rate.

8. The method of claim 7, wherein the forming the low-k layer forms the low-k layer adjacent adjacent to a dummy gate.

9. The method of claim 8, further comprising removing the dummy gate after the forming the low-k layer.

10. The method of claim 7, wherein the silicon-carbon source precursor further comprises a silicon compound.

11. The method of claim 7, wherein the low-k layer has a nitrogen concentration of less than about 3 at. %.

12. The method of claim 7, wherein the low-k layer has a carbon concentration in a range from greater than 0 atomic percent (at. %) to 30 at. %.

13. A method comprising:
    depositing a first spacer layer over a gate stack;
    sequentially introducing a first precursor and a second precursor to the first spacer layer to form a second spacer layer, the second spacer layer having a carbon concentration in a range from greater than 0 atomic percent (at. %) to 30 at. % and a nitrogen concentration from 0 at. % to 3 at. %, and wherein the second spacer layer has a density of between 1.0 g/cm3 to 3.0 g/cm3;

patterning the first spacer layer and the second spacer layer into a first spacer; and forming a source/drain region adjacent to the first spacer.

14. The method of claim 13, wherein the second spacer layer has a conformity of greater than 95% and less than 105%.

15. The method of claim 13, further comprising replacing the gate stack after the patterning the first spacer layer and the second spacer layer.

16. The method of claim 13, further comprising introducing a catalyst with the first precursor.

17. The method of claim 16, wherein the catalyst is pyridine.

18. The method of claim 13, wherein the second spacer layer has an increasing carbon concentration from a first side of the second spacer layer to a second side of the second spacer layer.

19. The method of claim 1, wherein the low-k layer has a density of between 1.0 $g/cm^3$ to 3.0 $g/cm^3$.

20. The method of claim 7, wherein the low-k layer has a density of between 1.0 $g/cm^3$ to 3.0 $g/cm^3$.

* * * * *

UNITED STATES PATENT AND TRADEMARK OFFICE
CERTIFICATE OF CORRECTION

PATENT NO. : 10,971,589 B2  
APPLICATION NO. : 16/715899  
DATED : April 6, 2021  
INVENTOR(S) : Kao Page 1 of 1

It is certified that error appears in the above-identified patent and that said Letters Patent is hereby corrected as shown below:

In the Claims

Column 14, Line 51, Claim 8, delete "adjacent adjacent" and insert --adjacent--.

Column 15, Line 3, Claim 13, delete "between 1.0 g/cm3 to 3.0 g/cm3" and insert --between 1.0 $g/cm^3$ to 3.0 $g/cm^3$--.

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*